(12) United States Patent
Lin et al.

(10) Patent No.: US 11,637,241 B2
(45) Date of Patent: Apr. 25, 2023

(54) RESISTIVE RANDOM ACCESS MEMORY AND MANUFACTURING METHOD THEREOFF

(71) Applicant: Winbond Electronics Corp., Taichung (TW)

(72) Inventors: Meng-Hung Lin, Taichung (TW); Bo-Lun Wu, Taichung (TW); Po-Yen Hsu, New Taipei (TW); Ying-Fu Tung, Taichung (TW); Han-Hsiu Chen, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 160 days.

(21) Appl. No.: 17/115,075

(22) Filed: Dec. 8, 2020

(65) Prior Publication Data
US 2021/0175421 A1 Jun. 10, 2021

(30) Foreign Application Priority Data
Dec. 9, 2019 (TW) ................................ 108144844

(51) Int. Cl.
*H01L 45/00* (2006.01)
*H01L 27/24* (2006.01)

(52) U.S. Cl.
CPC ........ *H01L 45/1266* (2013.01); *H01L 27/249* (2013.01); *H01L 27/2472* (2013.01); *H01L 45/1691* (2013.01)

(58) Field of Classification Search
CPC ............. H01L 45/1266; H01L 27/2472; H01L 27/249; H01L 45/1691; H01L 27/2463; H01L 45/1233; H01L 45/146; H01L 45/1253
See application file for complete search history.

(56) References Cited

U.S. PATENT DOCUMENTS 9,466,644 B2 10/2016 Matamis et al.
9,847,378 B2 * 12/2017 Sheng ................. H01L 45/1273

FOREIGN PATENT DOCUMENTS

TW        I604446 B     11/2017
WO   WO-2017/111812 A1  6/2017

* cited by examiner

*Primary Examiner* — Allison Bernstein
(74) *Attorney, Agent, or Firm* — Muncy Geissler Olds & Lowe P.C.

(57) ABSTRACT

A RRAM and its manufacturing method are provided. The RRAM includes an interlayer dielectric layer, a first bottom contact structure, and a second bottom contact structure formed on a substrate. A first memory cell is formed on the first bottom contact structure. The first memory cell includes a first bottom electrode layer which includes a first conductive region. A pattern in which the first conductive region is vertically projected on the first bottom contact structure is a first projection pattern. A second memory cell is formed on the second bottom contact structure. The second memory cell includes a second bottom electrode layer which includes a second conductive region. A pattern in which the second conductive region is vertically projected on the second bottom contact structure is a second projection pattern. The second projection pattern is different from the first projection pattern.

13 Claims, 7 Drawing Sheets

RESISTIVE RANDOM ACCESS MEMORY AND MANUFACTURING METHOD THEREOFF

CROSS REFERENCE TO RELATED APPLICATIONS

This Application claims priority of Taiwan Patent Application No. 108144844, filed on Dec. 9, 2019, the entirety of which is incorporated by reference herein.

BACKGROUND OF THE INVENTION

Field of the Invention

The present disclosure relates to a memory device, and in particular, it relates to a resistive random access memory for improving the randomness of readout current and a method for manufacturing the same.

Description of the Related Art

In the conventional resistive random access memory (RRAM), a plurality of memory cells are included in an array region, and each memory cell includes a patterned bottom electrode layer, a patterned resistance switching layer, and a patterned top electrode layer. When a forming voltage or a writing voltage is applied to the memory cell, oxygen ions are driven by the voltage and leave the resistance switching layer. The equivalent positive-charged oxygen vacancies left in the resistance switching layer form conductive paths (or conductive filaments), and therefore, the resistance switching layer is switched from a high resistance state to a low resistance state. When an erasing voltage is applied, oxygen ions return to the resistance switching layer and combine with the equivalent positive-charged oxygen vacancies. Therefore, the above-mentioned conductive paths disappear, and the resistance switching layer is switched from the low resistance state to the high resistance state. In general, the high resistance state corresponds to the logic state "0", and the low resistance state corresponds to the logic state "1".

In some applications (for example, artificial intelligence, encryption, etc.), it is preferred that the current values read from these memory cells (hereinafter referred to as readout current) are difficult to predict. That is, it is desirable that the randomness of the readout current is higher. However, the existing PRAM requires that these memory cells have a high degree of structural uniformity, so that the current values read from these memory cells have a highly uniform performance. Therefore, it is not easy to meet the needs of the applications, such as artificial intelligence, encryption, and so on.

In order to increase the randomness of the readout current, a conventional method is to use an additional control circuit to apply different voltages to the memory cells at different positions. However, such a method requires a complex circuit design, which greatly increases the complexity of the manufacturing process, the production time, and the production cost. Furthermore, this additional control circuit will also occupy a larger space, which is disadvantageous to miniaturization of the memory device.

In the memory industry, in order to meet the needs of artificial intelligence, encryption, and other applications, and in order to reduce the complexity of the manufacturing process, the production time, and the production cost, there is still a need to improve the RRAM array and its manufacturing process.

BRIEF SUMMARY OF THE INVENTION

The embodiments of the present invention provides a RRAM and a method for manufacturing the same. The manufacturing method can significantly increase the randomness of the readout current of the RRAM array, and can reduce the complexity of the manufacturing process, the production cost, and the production time.

In accordance with some embodiments of the present disclosure, a RRAM is provided. The RRAM includes a substrate, an interlayer dielectric layer, a first bottom contact structure, a second bottom contact structure, a first memory cell, and a second memory cell. The interlayer dielectric layer is formed on the substrate. The first bottom contact structure and the second bottom contact structure are formed in the interlayer dielectric layer. A top surface of the first bottom contact structure, a top surface of the second bottom contact structure, and a top surface of the interlayer dielectric layer are coplanar. The first memory cell is formed on the first bottom contact structure. The first memory cell comprises a first bottom electrode layer, and the first bottom electrode layer comprises a first conductive region. A pattern in which the first conductive region is vertically projected on the first bottom contact structure is a first projection pattern. The second memory cell is formed on the second bottom contact structure. The second memory cell comprises a second bottom electrode layer, and the second bottom electrode layer comprises a second conductive region. A pattern in which the second conductive region is vertically projected on the second bottom contact structure is a second projection pattern. The second projection pattern is different from the first projection pattern.

In accordance with some embodiments of the present disclosure, a method for manufacturing a RRAM is provided. The method includes forming an interlayer dielectric layer on a substrate. The method includes forming a first bottom contact structure and a second bottom contact structure in the interlayer dielectric layer. A top surface of the first bottom contact structure, a top surface of the second bottom contact structure, and a top surface of the interlayer dielectric layer are coplanar. The method includes forming a first memory cell on the first bottom contact structure. The first memory cell comprises a first bottom electrode layer, and the first bottom electrode layer comprises a first conductive region. A pattern in which the first conductive region is vertically projected on the first bottom contact structure is a first projection pattern. The method includes forming a second memory cell on the second bottom contact structure. The second memory cell comprises a second bottom electrode layer, and the second bottom electrode layer comprises a second conductive region. A pattern in which the second conductive region is vertically projected on the second bottom contact structure is a second projection pattern. The second projection pattern is different from the first projection pattern.

In the manufacturing method of the RRAM array provided in the embodiments of the present invention, by the patterned bottom electrode layer and the misalignment between the conductive region of the bottom electrode layer and the bottom contact structure, the projection pattern of the conductive region of the bottom electrode layer located in one memory cell vertically projected on the bottom contact structure is different from the projection pattern of the conductive region of the bottom electrode layer located in another memory cell vertically projected on the bottom contact structure. The conductive paths are mainly formed in the position of the resistance switching layer corresponding to the above-mentioned projection pattern, even if there are conductive paths formed in other positions of the resistance switching layer, the number of conductive paths formed in the other positions is significantly reduced. Furthermore, the contact resistance of the memory cell will vary with the contact area of the conductive region of the bottom electrode layer and the bottom contact structure. Therefore, the randomness of the readout current of the RRAM can be greatly increased without using an additional control circuit. As a result, it is possible to reduce the complexity of the manufacturing process, the production cost, and the production time, and it is advantageous for the miniaturization of the memory device.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The present disclosure is made for the purpose of illustrating the general principles of the invention and should not be taken in a limiting sense. The scope of the invention is best determined by reference to the appended claims. The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

Figure 1A:
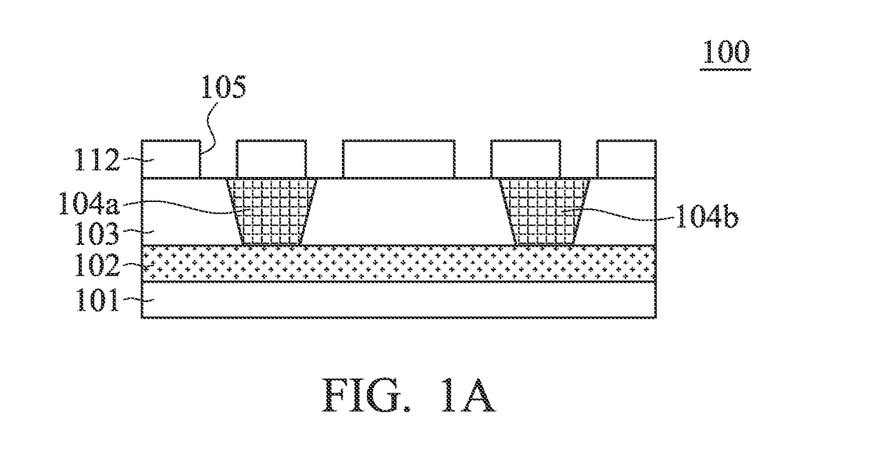
FIGS. 1A-1D are cross-sectional views corresponding to various steps of manufacturing a RRAM in accordance some embodiments.

FIGS. 1A-1D are cross-sectional views corresponding to various steps of manufacturing a RRAM 100 in accordance with some embodiments. Referring to FIG. 1A, an interlayer dielectric layer 103 is formed on a substrate 101. The material of the substrate 101 may include a bulk semiconductor substrate (for example, a silicon substrate), a compound semiconductor substrate (for example, a IIIA-VA group semiconductor substrate), a silicon on insulator (SOI) substrate, and so on. The substrate 101 may be a doped or an undoped semiconductor substrate. In some embodiments, the substrate 101 is a silicon substrate. The interlayer dielectric layer 103 may be suitable dielectric material, such as nitride, oxide, or oxynitride. In some embodiments, the interlayer dielectric layer 103 is silicon oxide.

Then, a plurality of conductive lines 102 and a plurality of bottom contact structures are formed in the interlayer dielectric layer 103. Two bottom contact structures 104a and 104b are shown in the figures, however, it is not intended to limit the present invention. More specifically, the interlayer dielectric layer 103 may be patterned by using a mask layer (not shown) to form a plurality of trenches in the interlayer dielectric layer 103. Then, a first conductive material is filled into the trenches, and the excess first conductive material on the interlayer dielectric layer 103 is removed by performing a planarization process (for example, a chemical mechanical polishing (CMP) process) to form the conductive lines 102 in the interlayer dielectric layer 103. After the conductive lines 102 is formed, the interlayer dielectric layer 103 is deposited again and patterned to form a plurality of contact holes in the interlayer dielectric layer 103. Similarly, a second conductive material is filled into the contact holes, and the excess second conductive material on the interlayer dielectric layer 103 is removed by performing a planarization process to form the bottom contact structures 104a and 104b in the interlayer dielectric layer 103. The trenches and the contact holes may be formed by suitable dry etching process (for example, a plasma etching process).

Figure 2:
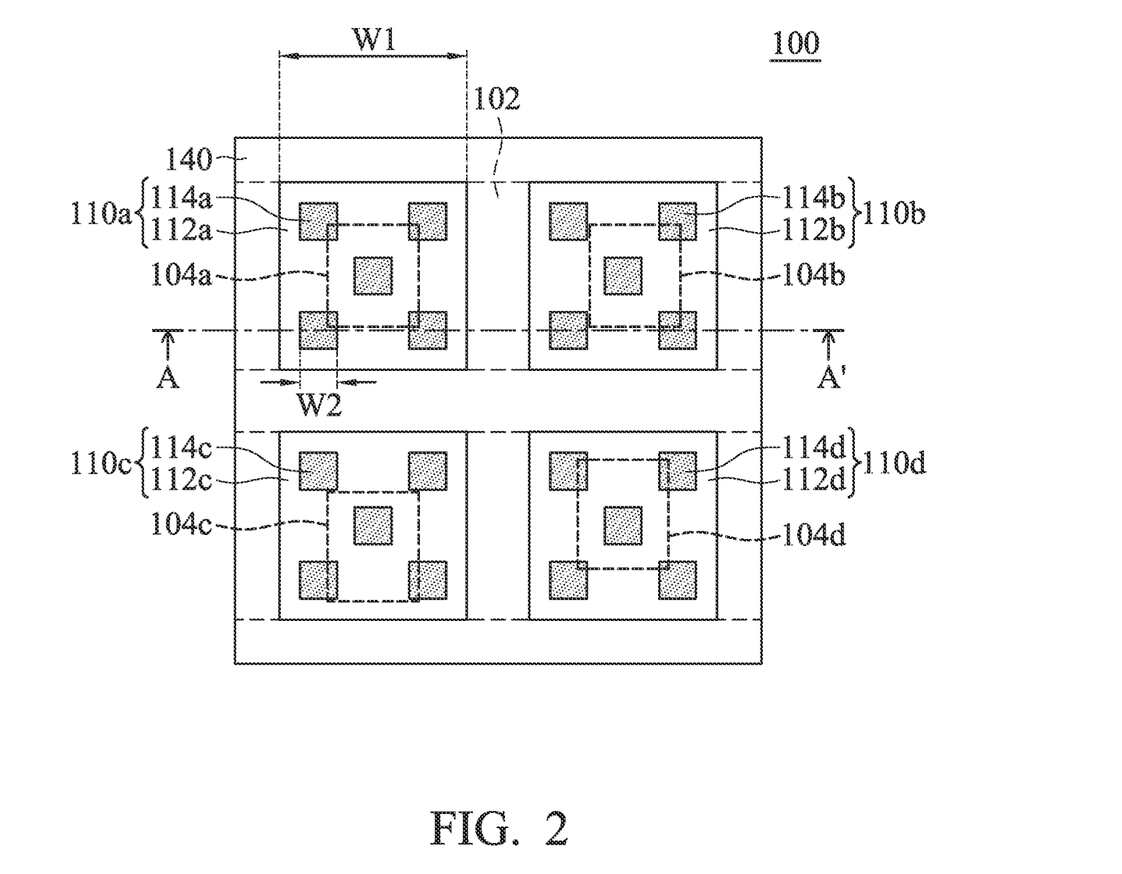
FIG. 2 is a top-view of a RRAM in accordance with some embodiments.

In the top-view (for example, FIG. 2), a plurality of conductive lines 102 parallel to each other and extend in a first direction (i.e., the horizontal direction). As shown in FIG. 1A, the conductive line 102 is formed directly below the bottom contact structures 104a and 104b, and the conductive line 102 is electrically connected to the bottom contact structures 104a and 104b. It should be understood that the positions and extending directions of the conductive lines 102 shown in FIG. 1A and FIG. 2 are for illustration only, and are not intended to limit the present invention.

In some embodiments, the first conductive material includes tungsten, aluminum, copper, silver, other suitable metals, or a combination thereof. In other embodiments, the second conductive material is different from the first conductive material, and the second conductive material is a dual-layer structure including a liner and a conductive filling material. The liner can improve the adhesion between the conductive filling material and the substrate 101 or the interlayer dielectric layer 103, and can prevent metal atoms from diffusing into the substrate 101 or the interlayer dielectric layer 103. The material of the liner may include titanium, titanium nitride, tungsten nitride, tantalum, tantalum nitride, or a combination thereof. The conductive filling material may include tungsten, copper, tantalum, aluminum, or a combination thereof.

Then, an insulating material layer 112 is formed on the substrate 101 and the interlayer dielectric layer 103. Next, a lithography process is performed to pattern the insulating material layer 112, and a plurality of openings 105 is formed in the insulating material layer 112. As shown in FIG. 1A, the top surfaces of the bottom contact structures 104a and 104b is partially exposed by the openings 105. Referring to FIG. 1A and FIG. 2, with respect to these openings 105, the exposed area of the top surface of the bottom contact structure 104a is a first exposed area, the exposed area of the top surface of the bottom contact structure 104b is a second exposed area, and the second exposed area is different from the first exposed area. It is advantageous for increasing the randomness of the readout current, and the details will be discussed in the following paragraphs. The insulating material layer 112 may be a suitable insulating material, for example, nitride, oxide, or oxynitride. In some embodiments, the insulating material layer 112 is silicon oxide. The opening 105 may be formed by a suitable dry etching process (for example, a plasma etching process).

Figure 1B:
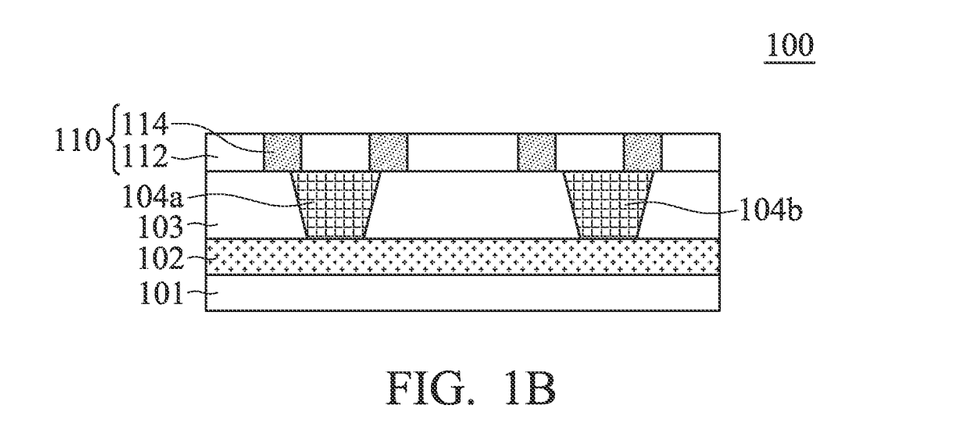

Referring to FIG. 1B, a bottom electrode material 114 is filled into the openings 105, and the bottom electrode material 114 is electrically connected to the bottom contact structures 104a and 104b. Then, a planarization process (for example, a CMP process) is performed to make the top surface of the bottom electrode material 114 and the top surface of the insulating material layer 112 coplanar. The bottom electrode material 114 may be titanium, tantalum, titanium nitride, tantalum nitride, another suitable conductive material, or a combination thereof. In some embodiments, the bottom electrode material 114 is titanium nitride. In other embodiments, the bottom electrode material 114 is titanium. The bottom electrode material 114 may be formed in the openings 105 by using a physical vapor deposition process, a chemical vapor deposition, or other suitable deposition process.

Figure 1C:
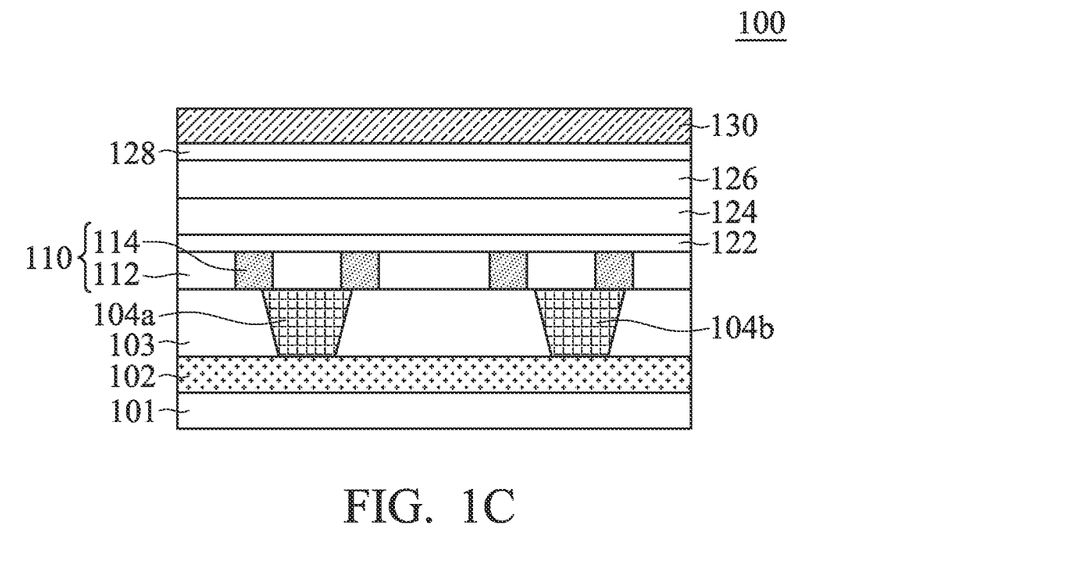

Referring to FIG. 1C, a diffusion barrier material 122 is deposited on the insulating material layer 112 and the bottom electrode material 114. The diffusion barrier material 122 can be used to block and limit the movement of oxygen ions. Therefore, it is possible to prevent the oxygen ions from diffusing into the bottom electrode material 114 from the subsequently formed resistance switching material 124, so as to prevent the oxidation of the bottom electrode material 114. The diffusion barrier material 122 may include aluminum oxide ($Al_xO_y$), titanium oxide ($Ti_xO_y$), tantalum oxide ($Ta_xO_y$), titanium oxynitride ($Ti_xO_yN_z$), hafnium oxide ($Hf_xO_y$), nickel oxide ($Ni_xO_y$), zirconium oxide ($Zr_xO_y$), or a combination thereof. In one embodiment, the diffusion barrier material 122 is aluminum oxide ($Al_2O_3$). In another embodiment, the diffusion barrier material 122 is titanium oxynitride (TiON).

Then, a resistance switching material 124 is formed on the diffusion barrier material 122. The resistance switching material 124 may include a transition metal oxide, for example, aluminum oxide ($Al_xO_y$), titanium oxide ($Ti_xO_y$), nickel oxide ($Ni_xO_y$), tantalum oxide ($Ta_xO_y$), hafnium oxide ($Hf_xO_y$), or zirconium oxide ($Zr_xO_y$). In one embodiment, the resistance switching material 124 is hafnium oxide ($HfO_2$). The resistance switching material 124 is different from the diffusion barrier material 122.

Then, an oxygen ion storage material 126 is optionally formed on the resistance switching material 124. The oxygen ion storage material 126 can be used to store the oxygen ions from the resistance switching material 124. The oxygen ion storage material 126 may include titanium (Ti), tantalum (Ta), hafnium (Hf), or zirconium (Zr). In some embodiments, the oxygen ion storage material 126 is titanium.

Then, a diffusion barrier material 128 is optionally formed on the oxygen ion storage material 126. The diffusion barrier material 128 can prevent the oxygen ions from diffusing from the resistance switching material 124 or the oxygen ion storage material 126 into the subsequently formed top electrode material 130, so as to prevent the oxidation of the top electrode material 130. The diffusion barrier material 128 may be the same as or similar to the diffusion barrier material 122. In some embodiments, the material of the diffusion barrier material 128 is aluminum oxide ($Al_2O_3$).

In the present embodiment, the oxygen ion storage material 126 and the diffusion barrier material 128 are sequentially firmed on the resistance switching material 124. It should be noted that the oxygen ion storage material 126 and/or the diffusion barrier material 128 may be added or omitted as needed.

Then, a top electrode material 130 is formed on the diffusion barrier material 128. The top electrode material 130 may include titanium, tantalum, titanium nitride, tantalum nitride, another suitable conductive material, or a combination thereof. The top electrode material 130 may be a single-layer structure formed of a single material or a multi-layer structure formed of a plurality of different materials. In some embodiments, the top electrode material 130 is a single-layer structure formed of titanium nitride. The diffusion barrier material 122, the resistance switching material 124, the oxygen ion storage material 126, the diffusion barrier material 128, and the top electrode material 130 may be independently formed by a physical vapor deposition process, a chemical vapor deposition process, an atomic layer deposition process, or other suitable deposition processes.

Figure 1D:
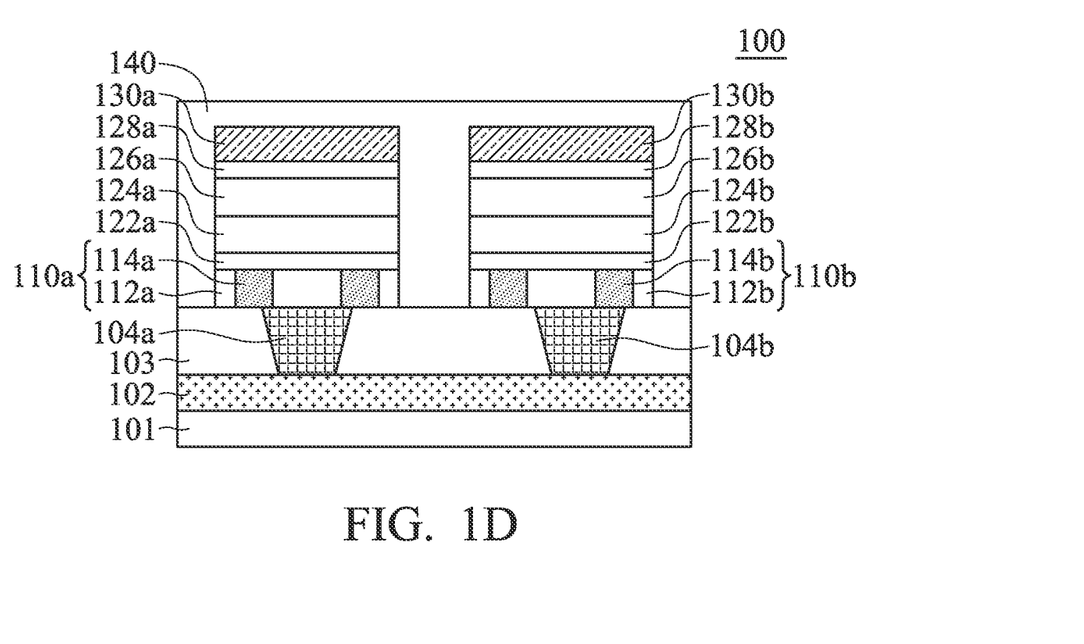

Referring to FIG. 1D, the top electrode material 130, the diffusion barrier material 128, the oxygen ion storage material 126, the resistance switching material 124, the diffusion barrier material 122, and the bottom electrode layer 110 are patterned, so that a first memory cell is formed on the first bottom contact structure 104a, and a second memory cell is formed on the second bottom contact structure 104b. The first memory cell includes a first bottom electrode layer 110a, a first oxygen ion diffusion barrier layer 122a, a resistance switching layer 124a, an oxygen ion storage layer 126a, a second oxygen ion diffusion barrier layer 128a, and a top electrode layer 130a. The top electrode layer 130a defines the range of the first bottom electrode layer 110a. The first bottom electrode layer 110a includes a first insulating region 112a and a first conductive region 114a. The second memory cell includes a second bottom electrode layer 110b, a first oxygen ion diffusion barrier layer 122b, a resistance switching layer 124b, an oxygen ion storage layer 126b, a second oxygen ion diffusion barrier layer 128b, and a top electrode layer 130b. The top electrode layer 130b defines the range of the second bottom electrode layer 110b. The second bottom electrode layer 110b includes a second insulating region 112b and a second conductive region 114b. Then, a protective layer 140 is formed to cover the first memory cell and the second memory cell. The protective layer 140 may be a single-layer structure formed of a single material or a multi-layer structure formed of a plurality of different materials. In some embodiments, the protective layer 140 is a dual-layer structure formed by a hydrogen-oxygen barrier layer and a capping layer formed on the hydrogen-oxygen barrier layer. In such embodiments, the hydrogen-oxygen barrier layer can prevent hydrogen and oxygen from entering the substrate 101 or each layer of the memory cell, and therefore, the degradation or failure of the RRAM array can be avoided. The material of the hydrogen-oxygen barrier layer may be metal oxide (for example, aluminum oxide), metal nitride, metal oxynitride, nitride, oxynitride, or a combination thereof. The capping layer can reduce or prevent the damage of the memory cells during the subsequent processes. The material of the capping layer may be nitride or oxynitride, for example, silicon dioxide. In other embodiments, the function and material of the hydrogen-oxygen barrier layer may be the same as or similar to the function and material of the capping layer. The protective layer 140 may include aluminum oxide, aluminum nitride, silicon nitride, silicon oxynitride, or a combination thereof. In the present embodiment, the protective layer 140 is a single-layer structure formed of aluminum oxide ($Al_2O_3$).

Afterwards, other conventional processes (for example, forming a top electrode contact structure on the top electrode layer 130) can be performed to complete the RRAM 100, and these conventional processes will not be described in detail herein.

FIG. 2 is a top-view of a RRAM 100 shown in FIG. 1A to FIG. 1D in accordance with some embodiments, and FIG. 1A to FIG. 1D are cross-sectional views taken along line A-A' of FIG. 2. Because the bottom contact structures 104a, 104b, 104c, and 104d are located under the bottom electrode layers 110a, 110b, 110c, and 110d, respectively, the bottom contact structures 104a, 104b, 104c, and 104d are drawn with dotted lines in the top-view (i.e., FIG. 2, FIG. 3, or FIG. 5).

In the manufacturing method of the RRAM 100 provided in this embodiment, the randomness of the readout current can be significantly increased without increasing the complexity of the manufacturing process, the production cost, and the production time.

In the process of forming a memory cell, the misalignment between the upper layer and the lower layer is easily to occur in many steps. For example, the above-mentioned misalignment may include misalignment occurring in the lithography process or the etching process. In a general lithography process, the same wafer is divided into multiple areas for exposure in stages. Therefore, even if the same photomask is used, the misalignment may still occur between different exposures. On the other hand, in the etching process, even if the opening patterns of the photomask used to define these memory cells are all designed to be the same, there may be deviations in the etching positions.

In the conventional RRAM, in order to ensure that the currents read from all the memory cells in the array have a highly uniform performance under the same conditions, the area of the bottom electrode layer in each memory cell is usually greater than the area of the bottom contact structure, and the bottom electrode layer completely covers the entire bottom contact structure. In this way, even if the misalignment between the bottom electrode layer and the bottom contact structure occurs, it can still ensure that the contact areas of all memory cells and the corresponding bottom contact structures are equal to one another.

In the manufacturing method of the RRAM provided in the embodiments of the present invention, the first bottom electrode layer 110a is formed by a first insulating region 112a and a first conductive region 114a arranged in a predetermined pattern. The second bottom electrode layer 110b is formed by a second insulating region 112b and a second conductive region 114b arranged in a predetermined pattern. In such an embodiment, the above-mentioned misalignment is more easily to occur, so that the readout current values of these memory cells under the same operating condition are different from each other, which is advantageous for certain applications (for example, artificial intelligence, encryption, etc.).

More specifically, referring to FIG. 1D and FIG. 2, the pattern in which the first conductive region 114a is vertically projected on the first bottom contact structure 104a is a first projection pattern, and this first projection pattern is composed by all the first conductive regions 114a located in the dotted frame in FIG. 2. Similarly, the pattern in which the second conductive region 114b is vertically projected on the second bottom contact structure second 104b is a second projection pattern, and this second projection pattern is composed by all the second conductive regions 114b located in the dotted frame in FIG. 2.

Still referring to FIG. 2, the RRAM 100 further includes a third memory cell (located in the lower left corner) and a fourth memory cell (located in the lower right corner). The third memory cell includes a third bottom electrode layer 110c formed by a third conductive region 114c and a third insulating region 112c, and the fourth memory cell includes a fourth bottom electrode layer 110d formed by a fourth conductive region 114d and a fourth insulating region 112d. The pattern in which the third conductive region 114c is vertically projected on the third bottom contact structure 104c is a third projection pattern, and this third projection pattern is composed by all the third conductive regions 114c located in the dotted frame in FIG. 2. The pattern in which the fourth conductive region 114d is vertically projected on the fourth bottom contact structure 104d is a fourth projection pattern, and this fourth projection pattern is composed by all the fourth conductive regions 114d located in the dotted frame in FIG. 2.

In the present embodiment, these bottom electrode layers 110a, 110b, 110c, and 110d have the same pattern. However, due to the above-mentioned misalignment, the first projection pattern, the second projection pattern, the third projection pattern, and the fourth projection pattern are different from each other. Furthermore, the contact area of the first conductive region 114a and the first bottom contact structure 104a (that is, the total area of the first projection pattern, which is equal to the first exposed area), the contact area of the second conductive region 114b and the second bottom contact structure 104b (that is, the total area of the second projection pattern, which is equal to the second exposed area), the contact area of the third conductive region 114c and the third bottom contact structure 104c (that is, the total area of the third projection pattern), and the contact area of the fourth conductive region 114d and the fourth bottom contact structure 104d (that is, the total area of the fourth projection pattern) are different form one another. Therefore, when the same operating voltage is applied, the current values read from the first memory cell, the second memory cell, the third memory cell, and the fourth memory cell are different from one another. As a result, the randomness of the readout current of the RRAM can be greatly increased without significantly increasing the complexity of the manufacturing process, the production cost, and the production time.

Figure 6:
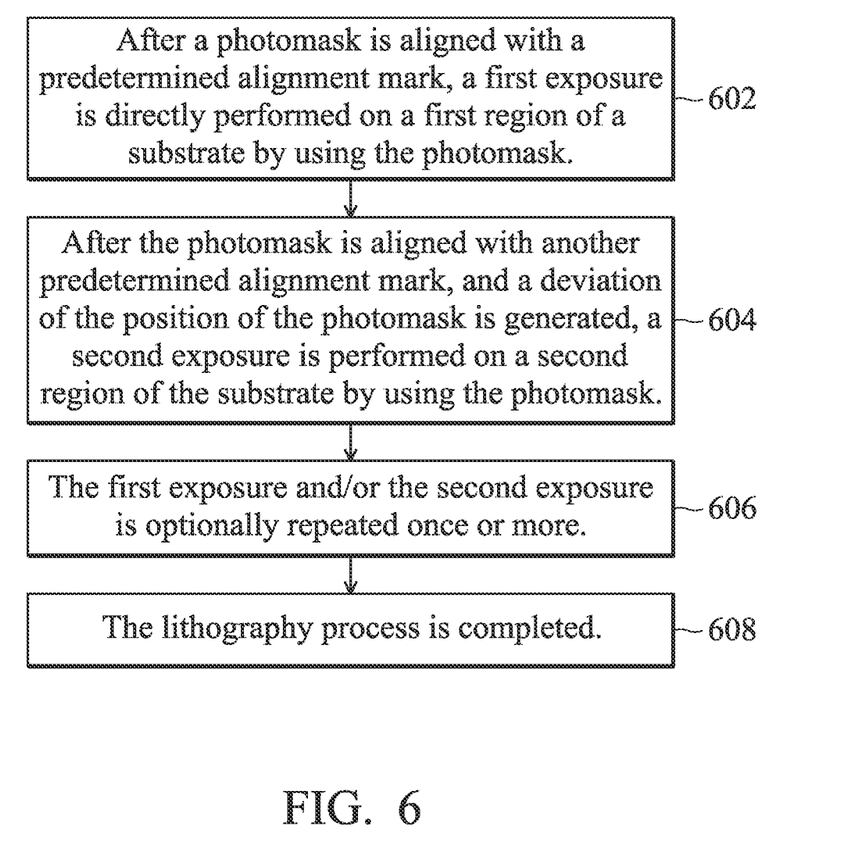
FIG. 6 is a flow chart of a lithography process in accordance with some embodiments.

In the manufacturing method of the RRAM provided in the embodiments of the present invention, the above-mentioned misalignment may also be controlled to occur in certain process steps as needed. FIG. 6 is a flow chart of a lithography process in accordance with some embodiments. In one embodiment, the lithography process shown in FIG. 1A can be performed according to the process shown in FIG. 6. Referring to step 602, a first exposure is performed on a first region of a substrate by using a photomask. After the photomask is aligned with a predetermined alignment mark, the first exposure is directly performed. Referring to step 604, a second exposure is performed on a second region of the substrate by using the photomask. After the photomask is aligned with another predetermined alignment mark, and a deviation of the position of the photomask is generated, the second exposure is performed. The above-mentioned deviation may be generated by moving the photomask along the horizontal direction and/or the vertical direction on the surface parallel to the substrate. Referring to step 606, the above-mentioned first exposure and/or second exposure may be optionally repeated once or more in other regions of this substrate. Referring to step 608, after all regions of the substrate are exposed, the lithography process is completed.

In such an embodiment, even if the above-mentioned misalignment does not occur, the bottom contact structures located at different positions can have different exposed patterns (or exposed areas). Therefore, the current values of the memory cells at different positions during the operation are different from one another. As a result, the randomness of the readout current of the RRAM can be greatly increased without significantly increasing the complexity of the manufacturing process, the production cost, and the production time.

Referring to FIG. 1D, in some embodiments, a RRAM 100 is provided. The RRAM 100 includes the conductive line 102, the interlayer dielectric layer 103, a plurality of bottom contact structures 104a and 104b, and the first memory cell and the second memory cell located on the substrate 101. The bottom contact structures 104a and 104b is located in the interlayer dielectric layer 103. The top surfaces of the bottom contact structures 104a and 104b and the top surface of the interlayer dielectric layer 103 are coplanar. The first memory cell and the second memory cell are located on the first bottom contact structure 104a and the second bottom contact structure 104b, respectively. The first memory cell includes the first bottom electrode layer 110a, and the first bottom electrode layer 110a includes the first insulating region 112a and the first conductive region 114a. The top surface of the first insulating region 112a and the top surface of the first conductive region 114a are coplanar. The second memory cell includes the second bottom electrode layer 110b, and the second bottom electrode layer 110b includes the second insulating region 112b and the second conductive region 114b. The top surface of the second insulating region 112b and the top surface of the second conductive region 114b are coplanar. The first bottom contact structure 104a is in direct contact with the first insulating region 112a and the first conductive region 114a. The second bottom contact structure 104b is in direct contact with the second insulating region 112b and the second conductive region 114b. The first memory cell also includes the first oxygen ion diffusion barrier layer 122a, the resistance switching layer 124a, the oxygen ion storage layer 126a, the second oxygen ion diffusion barrier layer 128a, and the top electrode layer 130a sequentially located on the first bottom electrode layer 110a. The second memory cell also includes the first oxygen ion diffusion barrier layer 122b, the resistance switching layer 124b, the oxygen ion storage layer 126b, the second oxygen ion diffusion barrier layer 128b, and the top electrode layer 130b sequentially located on the second bottom electrode layer 110b.

Referring to FIG. 1D and FIG. 2, in the present embodiment, the pattern in which the first conductive region 114a is vertically projected on the first bottom contact structure 104a is the first projection pattern. The pattern in which the second conductive region 114b is vertically projected on the second bottom contact structure 104b is the second projection pattern. The second projection pattern is different from the first projection pattern, and the total area of the second projection pattern is different from the total area of the first projection pattern. As described above, even if no additional control circuit is used, when the same operating voltage is applied, the current value read from the first memory cell and the current value read from the second memory cell are different from each other. In this way, the randomness of the readout current of the RRAM can be greatly increased without significantly increasing the complexity of the manufacturing process, the production cost, and the production time.

Referring to FIG. 1D and FIG. 2, in the present embodiment, the conductive line 102 is electrically connected to the bottom contact structures 104a and 104b. The first insulating region 112a and the first conductive region 114a of the first memory cell have a first arrangement, the second insulating region 112b and the second conductive region 114b of the second memory cell have a second arrangement, and the first arrangement is the same as the second arrangement.

If the thickness of the first oxygen ion diffusion barrier layer 122 is not uniform, the oxygen ions are easily to diffuse into the bottom electrode layers 110a and 110b in a thinner region. Therefore, the flatness under the first oxygen ion diffusion barrier layer 122 (that is, the flatness of the top surfaces of the bottom electrode layers 110a and 110b) is important. In the present embodiment, the bottom electrode material 114 is titanium nitride. If the bottom electrode material 114 is first formed on the entire surface of the interlayer dielectric layer 103, it is easy to form a plurality of columnar crystals in the bottom electrode material 114, resulting in an uneven surface. As a result, the subsequent lithography process may fail to pattern the bottom electrode material 114 into the desired shape. Therefore, before the lithography process is performed on the bottom electrode material 114, an additional planarization process must be performed on the bottom electrode material 114 to ensure that the bottom electrode layers 110a and 110b have flat top surfaces. This will increase the complexity of the manufacturing process, the production cost, and the production time.

In contrast, in the present embodiment, firstly, the insulating material layer 112 is formed and patterned to form the openings 105. Afterward, the bottom electrode material 114 is filled into the openings 105 and a planarization process is performed, so that the top surface of the insulating material layer 112 and the top surface of the bottom electrode material 114 are coplanar. Furthermore, referring to FIG. 1A, the top surfaces of the bottom contact structures 104a and 104b and the interlayer dielectric layer 103 are coplanar, which can facilitate the formation of the insulating material layer 112 with a uniform thickness. In the present embodiment, even if the insulating material layer 112 is formed on the entire surface of the interlayer dielectric layer 103, the top surface of the insulating material layer 112 will still be flat. Therefore, it is not necessary to perform the above-mentioned additional planarization process, and the lithography process can be directly performed on the insulating material layer 112. Furthermore, in the present embodiment, the bottom electrode material 114 is formed in the opening 105 with an aspect ratio of 0.5-4, so that the generation of columnar crystals can be avoided.

In other embodiments, the bottom electrode material 114 is metal (for example, titanium or tantalum). Because the metal material will not form the above-mentioned columnar crystals, in such an embodiment, the bottom electrode material 114 may be formed first, and afterward, the insulating material layer 112 may be formed in the opening of the bottom electrode material 114. Before performing the lithography process on the bottom electrode material 114, the additional planarization process described above is not required.

In addition, for the applications such as artificial intelligence or encryption, in order to take into account the ease of the process and the randomness of the readout current, the sizes of the insulating region and the conductive region of the bottom electrode layer may be controlled within an appropriate range. Referring to FIG. 2, in some embodiments, the side length W1 of the first insulating region 112a may be 200-800 nm, and the side length W2 of the first conductive region 114a may be 60-300 nm.

Figure 3:
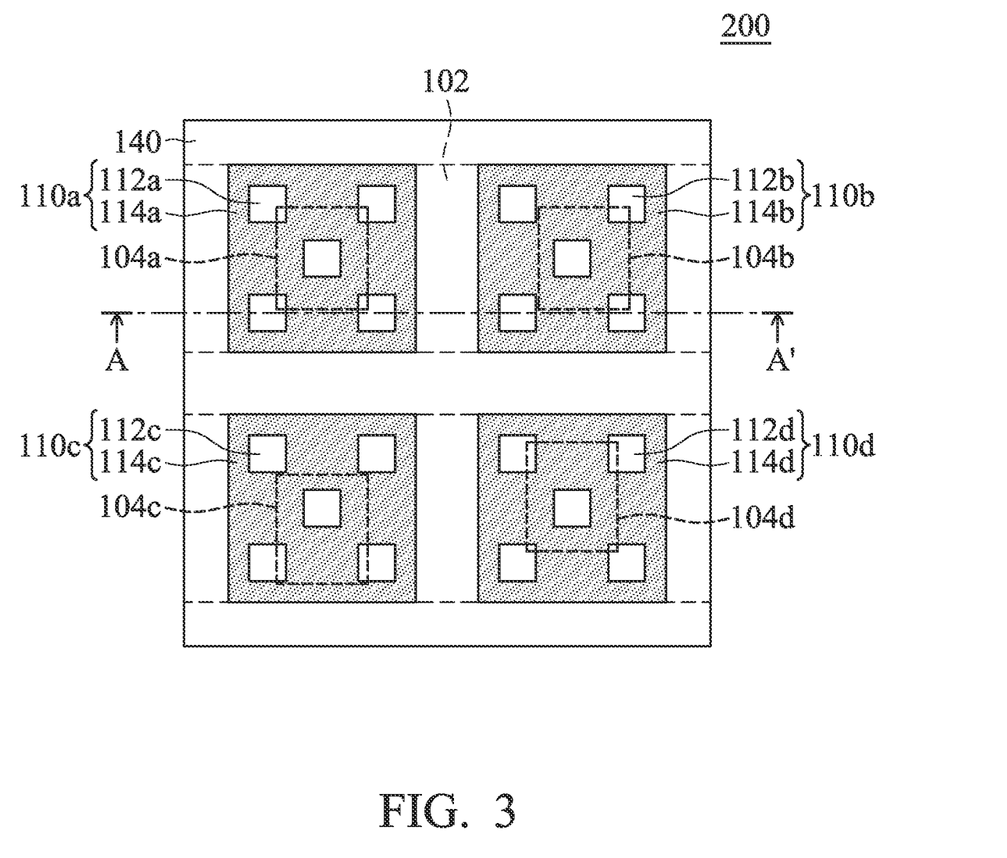
FIG. 3 is a top-view of a RRAM in accordance with other embodiments.

FIG. 3 is a top-view of a RRAM 200 in accordance with other embodiments. The RRAM 200 shown in FIG. 3 is similar to the RRAM 100 shown in FIG. 1D, and the difference is that the bottom electrode layer shown in FIG. 3 has different patterns. In order to simplify the description, the elements similar to those shown in FIG. 1D and the steps for forming the same are not described in detail herein.

The RRAM 200 shown in FIG. 3 may be formed by the process steps similar to FIG. 1A to FIG. 1D. In the present embodiment, when the lithography process of FIG. 1A is performed, an opening having a predetermined pattern (such as the pattern of the first conductive region 114a shown in FIG. 3) can be formed by changing the pattern of the photomask. Except for this, the remaining process steps are the same as those shown in FIG. 1A to FIG. 1D. In the present embodiment, the bottom electrode material 114 may be metal or metal nitride.

In other embodiments, when the bottom electrode material 114 is metal, the bottom electrode material 114 may be formed first, and afterward, the insulating material layer 112 may be filled into the opening formed in the bottom electrode material 114. Except for this, the remaining process steps are the same as those shown in FIG. 1A to FIG. 1D.

Referring to FIG. 2, in the first bottom electrode layer 110a, the first conductive region 114a includes a plurality of conductive portions separated from each other (that is, the five square regions surrounded by the first insulating region 112a in FIG. 2), and the first insulating region 112a surrounds these conductive portions. As mentioned above, the area of the top surface of each conductive portions is 6,000 $nm^2$-10,000 $nm^2$, so that the generation of columnar crystals can be avoided.

Referring to FIG. 3, the first bottom electrode layer 110a shown in FIG. 3 and the first bottom electrode layer 110a shown in FIG. 2 are complementary patterns. More specifically, in FIG. 3, the first insulating region 112a includes a plurality of insulating portions separated from each other (that is, the five square regions surrounded by the first conductive region 114a in FIG. 3), and the first conductive region 114a surrounds these insulating portions. Compared with FIG. 2, in the present embodiment, the contact area of the first conductive region 114a and the first bottom contact structure 104a is larger. Therefore, the contact resistance between the first bottom electrode layer 110a and the first bottom contact structure 104a can be further reduced, and the operation of the RRAM 100 can be facilitated.

FIGS. 4A-4D are top-views of first bottom electrode layers 110a in accordance with other embodiments.

Figure 4A:
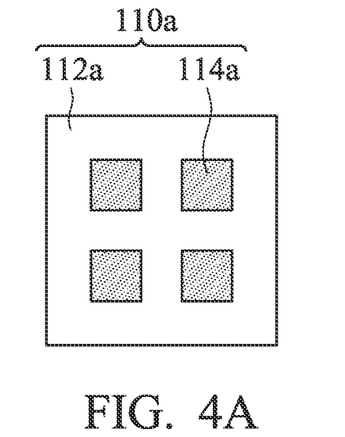
FIGS. 4A-4D are top-views of first bottom electrode layers in accordance with other embodiments.

Referring to FIG. 2 and FIG. 4A, the first bottom electrode layer 110a shown in FIG. 4A is similar to the first bottom electrode layer 110a shown in FIG. 2, and the difference is that the numbers and arrangements of the conductive portions of the first bottom electrode layer 110a shown in FIG. 4A are different.

Figure 4B:
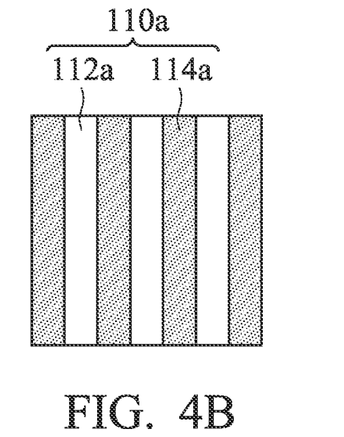

Referring to FIG. 4B, in the first bottom electrode layer 110a, the first insulating region 112a includes a plurality of elongated insulating portions, the first conductive region 114a includes a plurality of elongated conductive portions, and these insulating portions and these conductive parts are staggered with each other.

Figure 4C:
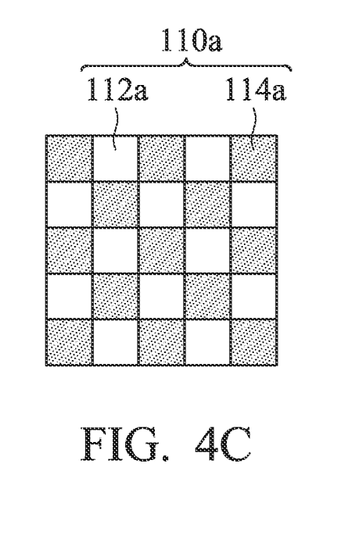

Referring to FIG. 4C, in the first bottom electrode layer 110a, the first insulating region 112a includes a plurality of rectangular insulating portions, the first conductive region 114a includes a plurality of rectangular conductive portions, and these insulating portions and these conductive portions are staggered with each other in a checkerboard pattern.

Figure 4D:
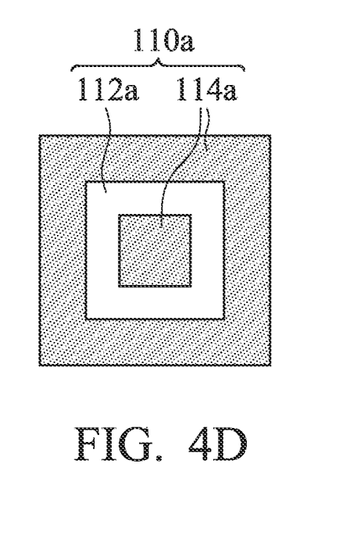

Referring to FIG. 4D, in the first bottom electrode layer 110a, the first insulating region 112a includes a ring-shaped insulating portion, the first conductive region 114a includes a ring-shaped conductive portion and a rectangular conductive portion, and the insulation portion staggered with these conductive portions. More specifically, the ring-shaped insulating portion surrounds the rectangular conductive portion, and the ring-shaped conductive portion surrounds the ring-shaped insulating portion.

Figure 5:
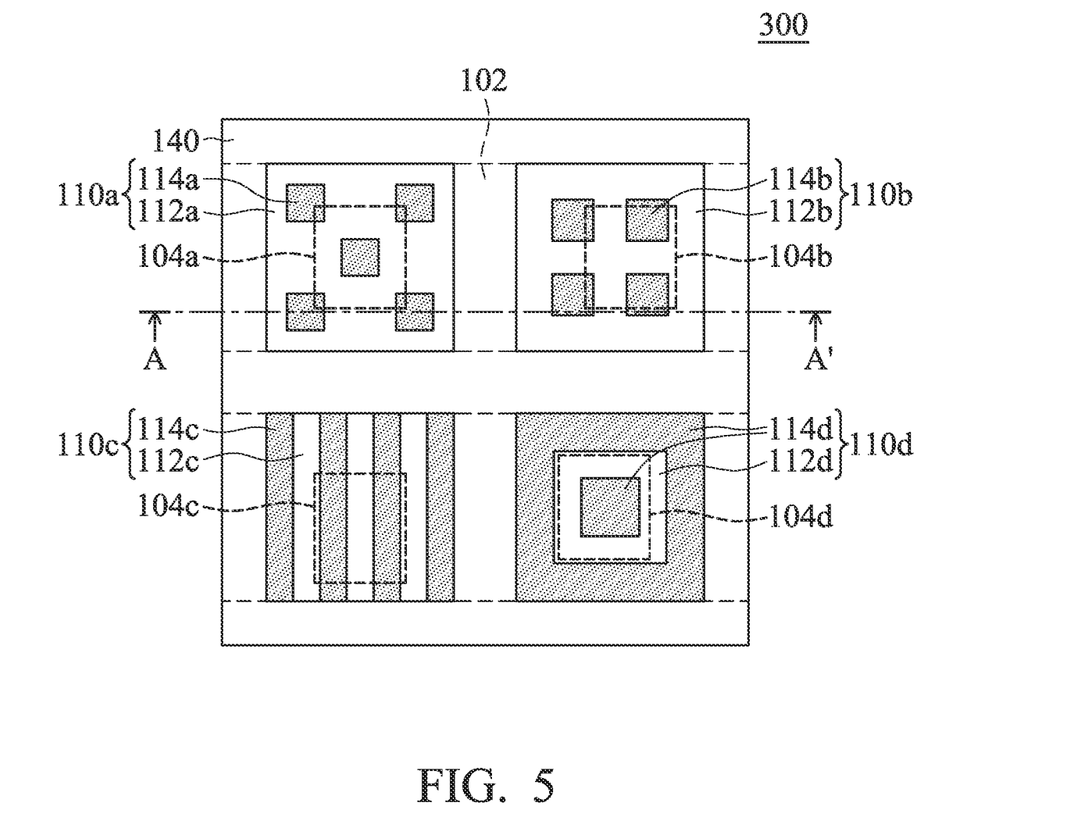
FIG. 5 is a top-view of a RRAM in accordance with other embodiments.

FIG. 5 is a top-view of a RRAM 300 in accordance with other embodiments. The RRAM 300 shown in FIG. 5 is similar to the RRAM 100 shown in FIG. 1D, and the difference is that the patterned bottom electrode layer shown in FIG. 5 has different patterns. In order to simplify the description, the elements similar to those shown in FIG. 1D and the steps for forming the same are not described in detail herein.

The RRAM 300 shown in FIG. 5 may be formed by the process steps similar to FIG. 1A to FIG. 1D. In the present embodiment, when the lithography process of FIG. 1A is performed, an opening having a predetermined pattern (such as the pattern shown in FIG. 5) can be formed by changing the pattern of the photomask. Except for this, the remaining process steps are the same as those shown in FIG. 1A to FIG. 1D. In the present embodiment, the bottom electrode material 114 may be metal or metal nitride.

In other embodiments, when the bottom electrode material 114 is metal, the bottom electrode material 114 may be formed first, and afterward, the insulating material layer 112 may be filled into the opening formed in the bottom electrode material 114. Except for this, the remaining process steps are the same as those shown in FIG. 1A to FIG. 1D.

In the present embodiment, in the RRAM 300, the patterned bottom electrode layer has the patterns different from one another. More specifically, referring to FIG. 5, the patterned bottom electrode layer of the RRAM 300 includes four kinds of patterns.

The first bottom electrode layer 110a includes a first insulating region 112a and a first conductive region 114a, and the pattern of the first bottom electrode layer 110a is the same as the pattern of the first bottom electrode layer 110a shown in FIG. 2. The second bottom electrode layer 110b includes a second insulating region 112b and a second conductive region 114b, and the pattern of the second bottom electrode layer 110b is the same as the pattern of the first bottom electrode layer 110a shown in FIG. 4A. The third bottom electrode layer 110c includes a third insulating region 112c and a third conductive region 114c, and the pattern of the third bottom electrode layer 110c is the same as the pattern of the first bottom electrode layer 110a shown in FIG. 4B. The fourth bottom electrode layer 110d includes a fourth insulating region 112d and a fourth conductive region 114d, and the pattern of the fourth bottom electrode layer 110d is the same as the pattern of the first bottom electrode layer 110a shown in FIG. 4D. In other words, in the RRAM 300, the first insulating region 112a and the first conductive region 114a of the first memory cell have a first arrangement; the second insulating region 112b and the second conductive region 114b of the second memory cell have a second arrangement; the third insulating region 112c and the third conductive region 114c of the third memory cell have a third arrangement; the fourth insulating region 112d and the fourth conductive region 114d of the fourth memory cell have a fourth arrangement. The first arrangement, the second arrangement, the third arrangement, and the fourth arrangement are different from one another.

In the present embodiment, the bottom electrode layers 110a, 110b, 110c, and 110d have the patterns different from one another. Therefore, regardless of whether the above-mentioned misalignment occurs, the first projection pattern, the second projection pattern, the third projection pattern, and the fourth projection pattern must be different from one another. Furthermore, the contact area of the first conductive region 114a and the first bottom contact structure 104a (that is, the total area of the first projected pattern), the contact area of the second conductive region 114b and the second bottom contact structure 104b (that is, the total area of the second projection pattern), the contact area of the third conductive region 114c and the third bottom contact structure 104c (that is, the total area of the third projection pattern), and the fourth conductive region 114d and the contact area of the fourth bottom contact structure 104d (that is, the total area of the fourth projection pattern) may also be different from one another. Therefore, when the operating voltage is applied, the current value of the first memory cell, the current value of the second memory cell, the current value of the third memory cell, and the current value of the fourth memory cell are different from one another. As a result, the randomness of the readout current of the RRAM can be greatly increased without significantly increasing the complexity of the manufacturing process, the production cost, and the production time.

It should be understood that the numbers and arrangements of the first insulating region 112a and the first conductive region 114a shown in FIG. 2, FIG. 3, FIGS. 4A-4D, and FIG. 5 are for illustration only, and are not intended to limit the present invention.

In summary, in the manufacturing method of the RRAM provided by the embodiments of the present invention, by the patterned bottom electrode layer and the misalignment between the conductive region of the bottom electrode layer and the bottom contact structure, the projection pattern of the conductive region of the bottom electrode layer located in one memory cell vertically projected on the bottom contact structure is different from the projection pattern of the conductive region of the bottom electrode layer located in another memory cell vertically projected on the bottom contact structure. Therefore, the randomness of the readout current of the RRAM can be greatly increased. Furthermore, the conductive region of the bottom electrode layer having a predetermined pattern can be formed by changing the pattern of the photomask used in the lithography process. Therefore, the manufacturing method provided in the embodiments of the present invention can be easily integrated into the existing manufacturing process of the RRAM without additional replacement or modification of production equipment. Under the premise of reducing the complexity of the manufacturing process, the production cost, and the production time, the randomness of the readout current of the RRAM can be greatly increased. In addition, in the RRAM provided in the embodiments of the present invention, no additional control circuit is required. Therefore, the premise of reducing the complexity of the manufacturing process, the production cost, and the production time can be reduced, and it is advantageous for the miniaturization of the memory device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A RRAM, comprising:
    a substrate;
    an interlayer dielectric layer formed on the substrate;
    a first bottom contact structure and a second bottom contact structure formed in the interlayer dielectric layer, wherein a top surface of the first bottom contact structure, a top surface of the second bottom contact structure, and a top surface of the interlayer dielectric layer are coplanar;
    a first memory cell formed on the first bottom contact structure, wherein the first memory cell comprises a first bottom electrode layer, and the first bottom electrode layer comprises a first conductive region, and wherein a pattern in which the first conductive region is vertically projected on the first bottom contact structure is a first projection pattern; and
    a second memory cell formed on the second bottom contact structure, wherein the second memory cell comprises a second bottom electrode layer, and the second bottom electrode layer comprises a second conductive region, wherein a pattern in which the second conductive region is vertically projected on the second bottom contact structure is a second projection pattern, and wherein the second projection pattern is different from the first projection pattern,
    wherein the first bottom electrode layer further comprises a first insulating region, and the first bottom contact structure is in direct contact with the first insulating region and the first conductive region.

2. The RRAM as claimed in claim 1, wherein a top surface of the first insulating region and a top surface of the first conductive region are coplanar.

3. The RRAM as claimed in claim 1, wherein the first conductive region comprises a plurality of conductive portions separated from each other, and wherein the first insulating region surrounds the conductive portions.

4. The RRAM as claimed in claim 1, wherein the first insulating region comprises a plurality of insulating portions separated from each other, and wherein the first conductive region surrounds the insulating portions.

5. The RRAM as claimed in claim 1, wherein the first insulating region comprises a plurality of insulating portions, wherein the first conductive region comprises a plurality of conductive portions, and wherein the insulating portions and the conductive portions are staggered with each other.

6. The RRAM as claimed in claim 1, wherein the first memory cell further comprises:
    an oxygen ion diffusion barrier layer formed on the first bottom electrode layer;
    a resistance switching layer formed on the oxygen ion diffusion barrier layer; and
    a top electrode layer formed on the resistance switching layer.

7. The RRAM as claimed in claim 1, wherein the second bottom electrode layer further comprises a second insulating region, and the second bottom contact structure is in direct contact with the second insulating region and the second conductive region.

8. The RRAM as claimed in claim 7, further comprising a conductive line, wherein the conductive line is electrically connected to the first bottom contact structure and the second bottom contact structure, wherein the first insulating region and the first conductive region of the first memory cell have a first arrangement, wherein the second insulating region and the second conductive region of the second memory cell have a second arrangement, and wherein the first arrangement is different from the second arrangement.

9. A method for manufacturing a RRAM, comprising:
forming an interlayer dielectric layer on a substrate;
forming a first bottom contact structure and a second bottom contact structure in the interlayer dielectric layer, wherein a top surface of the first bottom contact structure, a top surface of the second bottom contact structure, and a top surface of the interlayer dielectric layer are coplanar;
forming a first memory cell on the first bottom contact structure, wherein the first memory cell comprises a first bottom electrode layer, and the first bottom electrode layer comprises a first conductive region, and wherein a pattern in which the first conductive region is vertically projected on the first bottom contact structure is a first projection pattern; and
forming a second memory cell on the second bottom contact structure, wherein the second memory cell comprises a second bottom electrode layer, and the second bottom electrode layer comprises a second conductive region, wherein a pattern in which the second conductive region is vertically projected on the second bottom contact structure is a second projection pattern, and wherein the second projection pattern is different from the first projection pattern,
wherein the first bottom electrode layer further comprises a first insulating region, and the first bottom contact structure is in direct contact with the first insulating region and the first conductive region.

10. The method for manufacturing the RRAM as claimed in claim 9, wherein
forming the first memory cell and the second memory cell comprises:
forming a patterned bottom electrode layer on the substrate;
forming a diffusion barrier material on the patterned bottom electrode layer;
forming a resistance switching material on the diffusion barrier material;
forming a top electrode material on the resistance switching material; and
patterning the top electrode material, the resistance switching material, the diffusion barrier material, and the patterned bottom electrode layer, so that the first memory cell is formed on the first bottom contact structure, and the second memory cell is formed on the second bottom contact structure.

11. The method for manufacturing the RRAM as claimed in claim 10, wherein forming the patterned bottom electrode layer comprises:
forming an insulating material layer on the substrate;
performing a lithography process to form a plurality of openings in the insulating material layer, wherein the openings partially expose the top surface of the first bottom contact structure and the top surface of the second bottom contact structure;
filling a bottom electrode material into the openings; and
performing a planarization process to make a top surface of the bottom electrode material and a top surface of the insulating material layer coplanar.

12. The method for manufacturing the RRAM as claimed in claim 11, wherein after performing the lithography process, the top surface of the first bottom contact structure has a first exposed area, the top surface of the second bottom contact structure has a second exposed area, and the second exposed area is different from the first exposed area.

13. The method for manufacturing the RRAM as claimed in claim 11, wherein performing the lithography process comprises:
performing a first exposure on a first region of the substrate by using a photomask, wherein after the photomask is aligned with an alignment mark, the first exposure is directly performed; and
performing a second exposure on a second region of the substrate by using the photomask, wherein after the photomask is aligned with another predetermined alignment mark, and a deviation of the position of the photomask is generated, the second exposure is performed.

* * * * *